United States Patent
Chen et al.

(10) Patent No.: US 11,942,519 B2
(45) Date of Patent: Mar. 26, 2024

(54) SEMICONDUCTOR STRUCTURE AND HIGH ELECTRON MOBILITY TRANSISTOR

(71) Applicant: Vanguard International Semiconductor Corporation, Hsinchu (TW)

(72) Inventors: Chih-Yen Chen, Hsinchu (TW); Franky Juanda Lumbantoruan, Sumatera Utara (ID)

(73) Assignee: Vanguard International Semiconductor Corporation, Hsinchu (TW)

( * ) Notice: Subject to any disclaimer, the term of this patent is extended or adjusted under 35 U.S.C. 154(b) by 414 days.

(21) Appl. No.: 17/463,577

(22) Filed: Sep. 1, 2021

(65) Prior Publication Data

US 2023/0066042 A1 Mar. 2, 2023

(51) Int. Cl.
*H01L 29/205* (2006.01)
*H01L 29/15* (2006.01)
(Continued)

(52) U.S. Cl.
CPC .......... *H01L 29/205* (2013.01); *H01L 29/155* (2013.01); *H01L 29/2003* (2013.01); *H01L 29/207* (2013.01); *H01L 29/7786* (2013.01)

(58) Field of Classification Search
CPC . H01L 29/205; H01L 29/155; H01L 29/2003; H01L 29/207; H01L 29/7786;
(Continued)

(56) References Cited

U.S. PATENT DOCUMENTS 8,415,690 B2 * 4/2013 Miyoshi .............. H01L 21/0237
257/E33.049
9,029,868 B2 5/2015 Kotani
(Continued)

FOREIGN PATENT DOCUMENTS

TW 201612990 A 4/2016
TW 202017187 A 5/2020

OTHER PUBLICATIONS

[Chatterjee, Indranil, et al.], [Lateral charge transport in the carbon-doped buffer in AlGaN/GaN-on-Si HEMTs], [IEEE Transactions on Electron Devices] , [2017], [977-983], [64-3], [IEEE], [USA].

*Primary Examiner* — Allison Bernstein
(74) *Attorney, Agent, or Firm* — Winston Hsu

(57) ABSTRACT

A semiconductor structure includes a superlattice structure, an electrical isolation layer, a channel layer, and a composition gradient layer. The superlattice structure is disposed on a substrate, the electrical isolation layer is disposed on the superlattice structure, the channel layer is disposed on the electrical isolation layer, and the composition gradient layer is disposed between the electrical isolation layer and the superlattice structure. The composition gradient layer and the superlattice structure include a same group III element, and the atomic percentage of the same group III element in the composition gradient layer is gradually decreased in the direction from the superlattice structure to the electrical isolation layer. In addition, a high electron mobility transistor including the semiconductor structure is also provided.

16 Claims, 5 Drawing Sheets

(51) Int. Cl.
*H01L 29/20* (2006.01)
*H01L 29/207* (2006.01)
*H01L 29/778* (2006.01)

(58) Field of Classification Search
CPC ............. H01L 29/1066; H01L 29/1075; H01L 29/66462; H01L 29/41766
See application file for complete search history.

(56) References Cited

U.S. PATENT DOCUMENTS

| | | | |
|---|---|---|---|
| 2013/0307024 A1* | 11/2013 | Kokawa | ................ H01L 29/201 257/190 |
| 2016/0126312 A1 | 5/2016 | Moens | |
| 2021/0057561 A1* | 2/2021 | Hsieh | ................ H01L 21/02458 |

* cited by examiner

SEMICONDUCTOR STRUCTURE AND HIGH ELECTRON MOBILITY TRANSISTOR

BACKGROUND OF THE INVENTION

1. Field of the Invention

The present disclosure relates generally to the field of semiconductor devices, and more particularly to a semiconductor structure and a high electron mobility transistor including the semiconductor structure.

2. Description of the Prior Art

In semiconductor technology, group III-V compound semiconductor may be used to construct various integrated circuit (IC) devices, such as high power field-effect transistors (FETs), high frequency transistors, or high electron mobility transistors (HEMTs). A HEMT is a field effect transistor having a two dimensional electron gas (2-DEG) layer close to a junction between two materials with different band gaps (i.e., a hetero-junction). The 2-DEG layer is used as the transistor channel instead of a doped region, as is generally the case for metal oxide semiconductor field effect transistors (MOSFETs). Compared with MOSFETs, HEMTs have a number of attractive properties such as high electron mobility and the ability to transmit signals at high frequencies.

A conventional HEMT may include a channel layer, a barrier layer, a compound semiconductor cap layer, and a gate electrode stacked in sequence. Using the gate electrode to apply a bias voltage on the compound semiconductor cap layer may adjust the concentration of 2-DEG in the channel layer located under the compound semiconductor cap layer, thereby controlling the turn-on/off of the HEMT.

However, the aforementioned HEMT's stacked layers will produce stress due to lattice mismatch, thereby forming a polarization effect to cause leakage current in the HEMT. Thus, the electrical performance of the HEMT is reduced.

SUMMARY OF THE INVENTION

In view of this, it is necessary to provide an improved high electron mobility transistor (HEMT) without the drawbacks of conventional HEMTs to enhance the electrical performances of the HEMT.

According to one embodiment of the present disclosure, a semiconductor structure is provided and includes a superlattice structure, an electrical isolation layer, a channel layer and a composition gradient layer. The superlattice structure is disposed on a substrate, the electrical isolation layer is disposed on the superlattice structure, the channel layer is disposed on the electrical isolation layer, and the composition gradient layer is disposed between the electrical isolation layer and the superlattice structure. The composition gradient layer and the superlattice structure include a same group III element, and the atomic percentage of the same group III element in the composition gradient layer is gradually decreased in the direction from the superlattice structure to the electrical isolation layer.

According to one embodiment of the present disclosure, a high electron mobility transistor (HEMT) is provided and includes the aforementioned semiconductor structure, a barrier layer, a doped semiconductor cap layer, a gate electrode, a source electrode and a drain electrode. The barrier layer is disposed on the aforementioned channel layer, the doped semiconductor cap layer is disposed on the barrier layer, the gate electrode is disposed on the doped semiconductor cap layer, and the source electrode and the drain electrode are disposed on two opposite sides of the gate electrode respectively.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
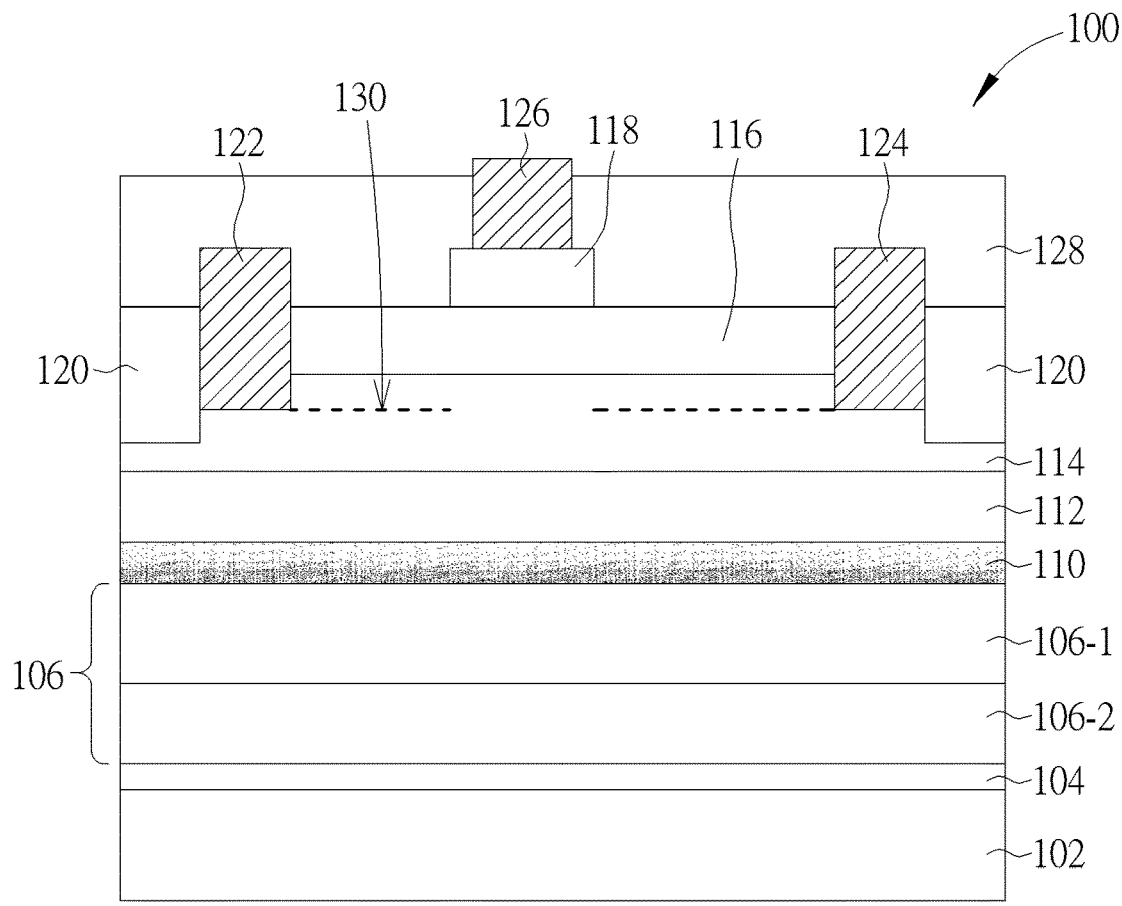
FIG. 1 is a schematic cross-sectional diagram of a high electron mobility transistor (HEMT) according to one embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "under", "over", "above", "upper", "bottom", "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "under" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first", "second", and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

In the present disclosure, a "group III-V semiconductor" refers to a compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, group III-V semiconductor may contain dopants to become semiconductor with specific conductivity type, such as n-type or p-type.

Although the disclosure is described with respect to specific embodiments, the principles of the invention, as defined by the claims appended herein, can obviously be applied beyond the specifically described embodiments of the invention described herein. Moreover, in the description of the present disclosure, certain details have been left out in order to not obscure the inventive aspects of the disclosure. The details left out are within the knowledge of a person having ordinary skill in the art.

The present disclosure is directed to a semiconductor structure and a high electron mobility transistor (HEMT) including the semiconductor structure, which may be used as power switching transistors for voltage converter applications. Compared to silicon power transistors, group III-V semiconductor HEMTs (III-V HEMTs) feature low on-state resistances and low switching losses due to wide band gap properties.

FIG. 1 is a schematic cross-sectional diagram of a HEMT according to one embodiment of the present disclosure. Referring to FIG. 1, according to one embodiment, a HEMT 100 such as an enhancement mode HEMT is disposed on a substrate 102. In addition, a nucleation layer 104, a superlattice (SL) structure 106, a composition gradient layer 110, an electrical isolation layer 112, a channel layer 114, a barrier layer 116, a doped semiconductor cap layer 118, and a passivation layer 128 are disposed on the substrate 102 in sequence. In an embodiment, the superlattice structure 106 may include two or more different superlattice stacks, for example, a first superlattice stack 106-1 is disposed on a second superlattice stack 106-2. Each superlattice stack may include a plurality of pairs of superlattice layers, and the superlattice layers may be stacked in a periodic alternate sequence. Each superlattice layer may be composed of two or more materials, and the thickness of each superlattice layer is about several nanometers (nm) to tens of nanometers. The first superlattice stack 106-1 and the second superlattice stack 106-2 may have different materials, different composition ratios, or different periodic alternate stacking modes. In another embodiment, the superlattice structure 106 may be a single superlattice stack, for example, the first superlattice stack 106-1.

Moreover, the HEMT 100 further includes a gate electrode 126, a source electrode 122, and a drain electrode 124. The gate electrode 126 is disposed on the doped semiconductor cap layer 118 and passes through the passivation layer 128. The source electrode 122 and the drain electrode 124 are disposed on two opposite sides of the gate electrode 126 respectively. According to some embodiments, the source electrode 122 and the drain electrode 124 may extend downward from the passivation layer 128 to the barrier layer 116 or the channel layer 114, and are separated from the electrical isolation layer 112 by a vertical distance. In addition, an isolation region 120 is disposed to surround the source electrode 122 and the drain electrode 124 to isolate the adjacent HEMTs from each other. The isolation region 120 passes through the barrier layer 116 into the channel layer 114, and the bottom of the isolation region 120 is lower than the bottoms of the source electrode 122 and the drain electrode 124, so that the isolation region 120 is closer to the electrical isolation layer 112 than the source electrode 122 and the drain electrode 124 are to achieve a good electrical isolation. However, in other embodiments, the isolation region 120 may extend to other layers according to actual requirements to achieve electrical isolation.

According to one embodiment of the present disclosure, the channel layer 114 may include one or more group III-V semiconductor layers. The composition of the group III-V semiconductor layer may be GaN, AlGaN, InGaN, or InAlGaN, but not limited thereto. In addition, the channel layer 114 may be one or more group III-V semiconductor layers that are undoped or doped. The doped channel layer 114 is, for example, a p-type group III-V semiconductor layer. For the p-type group III-V semiconductor layer, the dopant may be carbon (C), iron (Fe), magnesium (Mg) or zinc (Zn), but not limited thereto. The barrier layer 116 may include one or more group III-V semiconductor layers, and the composition of the barrier layer 116 is different from the group III-V semiconductor of the channel layer 114. For example, the barrier layer 116 may include AlN, $Al_zGa_{(1-z)}N$ (0<z<1), or a combination thereof. In one embodiment, the channel layer 114 may be an undoped GaN layer, and the barrier layer 116 may be an undoped or an intrinsic n-type AlGaN layer. Since there is a discontinuous energy gap between the channel layer 114 and the barrier layer 116, by stacking the channel layer 114 and the barrier layer 116 on each other, electrons will be gathered in the hetero-junction between the channel layer 114 and the barrier layer 116 due to the piezoelectric effect. Therefore, a thin layer with high electron mobility, i.e., a two-dimensional electron gas (2-DEG) region 130 is generated. For normally off devices, when no voltage is applied to the gate electrode 126, the area covered by the doped semiconductor cap layer 118 will not form 2-DEG, which may be regarded as a 2-DEG cut-off region, and there is no conduction between the source electrode 122 and the drain electrode 124 at this time. When a positive voltage is applied to the gate electrode 126, the area covered by the doped semiconductor cap layer 118 will form 2-DEG, so that the 2-DEG region 130 between the source electrode 122 and the drain electrode 124 becomes continuous, and there is conduction between the source electrode 122 and the drain electrode 124.

Figure 2:
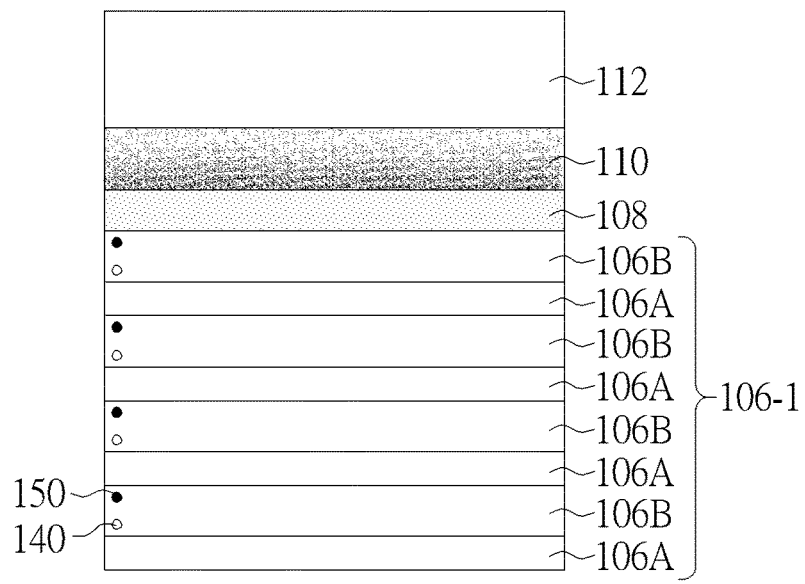
FIG. 2 is a schematic enlarged cross-sectional diagram of a first superlattice stack, a tensile stress layer, a composition gradient layer, and an electrical isolation layer of a HEMT according to another embodiment of the present disclosure.

FIG. 2 is a schematic enlarged cross-sectional diagram of a first superlattice stack, a tensile stress layer, a composition gradient layer, and an electrical isolation layer of a HEMT according to another embodiment of the present disclosure. The difference between the embodiments of FIG. 2 and FIG. 1 is that there is a tensile stress layer 108 disposed between a first superlattice stack 106-1 and a composition gradient layer 110 of FIG. 2. As shown in FIG. 2, according to an embodiment, the first superlattice stack 106-1 of the HEMT 100 may be composed of a plurality of pairs of first superlattice layers 106A and second superlattice layers 106B stacked in pairs. Although FIG. 2 only shows four pairs of stacked superlattice layers, according to other embodiments of the present disclosure, the first superlattice stack 106-1 may be composed of more pairs of stacked superlattice layers, for example, the first superlattice stack 106-1 may be composed of more than 100 pairs of stacked superlattice layers. In one embodiment, the first superlattice layer 106A has tensile stress, the second superlattice layer 106B has compressive stress, and the second superlattice layer 106B is stacked on the first superlattice layer 106A. In other words, the first superlattice layer 106A generates tensile stress on the adjacent second superlattice layer 106B, and the second superlattice layer 106B generates compressive stress on the adjacent first superlattice layer 106A. By adjusting the thickness of each layer of the first superlattice layers 106A and the second superlattice layers 106B, a 2-DEG 150 and a 2-DHG 140 are paired with each other in each of the second superlattice layers 106B other than the uppermost second superlattice layer 106B, thereby offsetting the effects of 2-DEG layer and 2-DHG layer by each other. In addition, according to an embodiment of the present disclosure, a tensile stress layer 108 is disposed on the uppermost second superlattice layer 106B, so that a 2-DEG is generated in the uppermost second superlattice layer 106B to offset the 2-DHG in the upper second superlattice layer 106B. Accordingly, a 2-DHG layer that is not paired with 2-DEG is not generated in the uppermost second superlattice layer 106B, thereby preventing the generation of lateral current transmission paths in the HEMTs. Therefore, leakage current between the adjacent HEMTs is avoided.

In addition, according to an embodiment of the present disclosure, a composition gradient layer 110 is disposed between the electrical isolation layer 112 and the first superlattice stack 106-1 of the superlattice structure 106, and the composition gradient layer 110 is disposed on the tensile stress layer 108. The composition gradient layer 110 may be used to eliminate the compressive stress of the electrical isolation layer 112 to the tensile stress layer 108. According to an embodiment of the present disclosure, the compositions of the superlattice structure 106, the tensile stress layer 108, and the composition gradient layer 110 include a same group III element. The atomic percentage of the same group III element in the composition gradient layer 110 is gradually decreased in the direction from the superlattice structure 106 to the electrical isolation layer 112, thereby preventing the electrical isolation layer 112 from generating compressive stress. Therefore, 2-DHG will not be generated at the interface between the electrical isolation layer 112 and the composition gradient layer 110. Accordingly, there is no 2-DHG layer generated on the bottom surface of the electrical isolation layer 112, thereby preventing the generation of lateral current transmission paths in the HEMTS and avoiding leakage current between the adjacent HEMTs.

Furthermore, according to an embodiment of the present disclosure, through adjusting the components of the composition gradient layer 110, the bottom of the composition gradient layer 110 will have tensile stress, thereby generating tensile stress on the uppermost second superlattice layer 106B, and producing 2-DEG in the uppermost second superlattice layer 106B to offset the 2-DHG in the uppermost second superlattice layer 106B. Therefore, even if the tensile stress layer 108 is not disposed, the degree of leakage current between the adjacent HEMTs is also reduced.

Moreover, in addition to avoiding leakage current between the adjacent HEMTs, the embodiments of the present disclosure provide a good lattice matching between the stacked layers of the HEMT due to the compositions of the composition gradient layer 110, the tensile stress layer 108 and the superlattice structure 106. Accordingly, the embodiments of the present disclosure avoid the generation of stress in the HEMT's stacked layers, thereby avoiding the polarization effect to be generated in the HEMTs. Therefore, various leakage currents of the HEMTs are reduced according to the embodiments of the present disclosure, and the electrical performances of the HEMTs are also improved.

According to an embodiment of the present disclosure, the composition of the composition gradient layer 110 may be a ternary group III-V semiconductor, such as aluminum gallium nitride ($Al_xGa_{(1-x)}N$), wherein $0.1<x<0.9$, and the value of x is gradually decreased in the direction from the superlattice structure 106 to the electrical isolation layer 112, i.e., in the depth direction, the atomic percentage of the same group III element such as aluminum (Al) in the composition gradient layer 110 is gradually decreased from bottom to top. The atomic percentage of another group III element such as gallium (Ga) in the composition gradient layer 110 is gradually increased from bottom to top. The electrical isolation layer 112 also includes the aforementioned another group III element such as gallium (Ga). In one embodiment, the composition of the tensile stress layer 108 may be a binary group III-V semiconductor, such as aluminum nitride (AlN). According to an embodiment, the average atomic concentration of the same group III element such as aluminum (Al) in the tensile stress layer 108 is higher than the average atomic concentration of the same group III element such as aluminum (Al) in the composition gradient layer 110. Moreover, in one embodiment, the thickness of the composition gradient layer 110 may be 0.5% to 5% of the thickness of the electrical isolation layer 112. The thickness of the tensile stress layer 108 may be 0.2% to 2% of the thickness of the electrical isolation layer 112. It should be noted that the thickness of the composition gradient layer 110 and the thickness of the tensile stress layer 108 must be greater than the thickness of each superlattice layer, for example, greater than the thickness of the first superlattice layer 106A or the thickness of the second superlattice layer 106B. When the composition gradient layer 110 and the tensile stress layer 108 are in the thickness range mentioned above, they are able to produce or eliminate the stress on the interface. According to an embodiment of the present disclosure, the composition gradient layer 110 may be doped with a dopant. The dopant may be carbon or iron, thereby increasing the resistivity of the composition gradient layer 110.

According to an embodiment of the present disclosure, while comparing the first superlattice layer 106A and the second superlattice layer 106B, the composition of the first superlattice layer 106A, for example, aluminum nitride (AlN), has a smaller lattice constant and a wider energy gap, and the composition of the second superlattice layer 106B, for example, aluminum gallium nitride ($Al_yGa_{(1-y)}N$, wherein $0.05<y<0.3$), has a larger lattice constant and a narrower energy gap. The average atomic concentration of the same group III element such as aluminum (Al) in the composition gradient layer 110 is higher than the average atomic concentration of the same group III element such as aluminum (Al) in the second superlattice layers 106B. According to an embodiment, the atomic percentages of aluminum (Al) in each second superlattice layer 106B in the first superlattice stack 106-1 may be different from each other. In other words, the atomic percentage of gallium (Ga) in each second superlattice layer 106B may also be different from each other. For example, the atomic percentage of aluminum (Al) in each second superlattice layer 106B may be varied with each layer, such as being decreased from the lower layer to the upper layer, so as to reduce the stress of the first superlattice stack 106-1. In addition, according to an embodiment, the first superlattice layers 106A and the second superlattice layers 106B of the first superlattice stack 106-1 may be doped with a dopant. The dopant may be carbon or iron, thereby increasing the resistivity of the first superlattice stack 106-1.

In addition, according to an embodiment of the present disclosure, as shown in FIG. 1, the superlattice structure 106 may further include a second superlattice stack 106-2 disposed under the first superlattice stack 106-1. The second superlattice stack 106-2 is similar to the first superlattice stack 106-1 as shown in FIG. 2. The second superlattice stack 106-2 may be composed of a plurality of pairs of third superlattice layers and fourth superlattice layers that are stacked in pairs, where the third superlattice layer has tensile stress, the fourth superlattice layer has compressive stress, and the fourth superlattice layer is stacked on the third superlattice layer. Through adjusting the thickness of each layer of the third superlattice layers and the fourth superlattice layers, there is no unpaired 2-DEG layer and 2-DHG layer generated in the second superlattice stack 106-2. Moreover, in one embodiment, the composition of the third superlattice layer is, for example, aluminum nitride (AlN), and the composition of the fourth superlattice layer is, for example, aluminum gallium nitride ($Al_wGa_{(1-w)}N$, wherein $0.1<w<0.5$). The average atomic concentration of aluminum (Al) in the second superlattice stack 106-2 is higher than the average atomic concentration of aluminum (Al) in the first superlattice stack 106-1. In one embodiment, the atomic percentage of aluminum (Al) in each fourth superlattice layer may be different from each other. In other words, the atomic percentage of gallium (Ga) in each fourth superlattice layer may also be different from each other. For example, the atomic percentage of aluminum (Al) in each fourth superlattice layer may be varied with each layer, such as being gradually decreased from the lower layer to the upper layer, so as to reduce the stress of the second superlattice stack 106-2. In addition, according to an embodiment, the third superlattice layers and the fourth superlattice layers of the second superlattice stack 106-2 may be doped with a dopant. The dopant may be carbon or iron, thereby increasing the resistivity of the second superlattice stack 106-2.

According to an embodiment, the average atomic concentration of the same group III element such as aluminum (Al) in the composition gradient layer 110 is higher than the average atomic concentration of the same group III element such as aluminum (Al) in the fourth superlattice layers.

Furthermore, according to an embodiment of the present disclosure, the average atomic concentration of the same group III element such as aluminum (Al) in the composition gradient layer 110 is lower than the average atomic concentration of the same group III element such as aluminum (Al) in the overall superlattice structure 106. In one embodiment, the thickness of the tensile stress layer 108 is greater than the thickness of each superlattice layer in the superlattice structure 106, for example, greater than the thickness of the first superlattice layer 106A, and greater than the thickness of the second superlattice layer 106B of the first superlattice stack 106-1. In addition, the thickness of the tensile stress layer 108 is also greater than the thickness of the third superlattice layer, and greater than the thickness of the fourth superlattice layer of the second superlattice stack 106-2.

According to an embodiment of the present disclosure, the composition of the electrical isolation layer 112 may be a doped or undoped binary group III-V semiconductor, such as carbon-doped gallium nitride (c-GaN). The concentration of the carbon dopant in the electrical isolation layer 112 is gradually increased in the direction from the composition gradient layer 110 to the channel layer 114. In other words, in the depth direction, the concentration of the carbon dopant in the electrical isolation layer 112 is gradually increased from bottom to top, so as to prevent the carbon dopant from accumulating at the interface between the electrical isolation layer 112 and the composition gradient layer 110. Accordingly, the surface of the electrical isolation layer 112 closer to the channel layer 114 has a higher resistance to provide a better electrical isolation.

Figure 3:
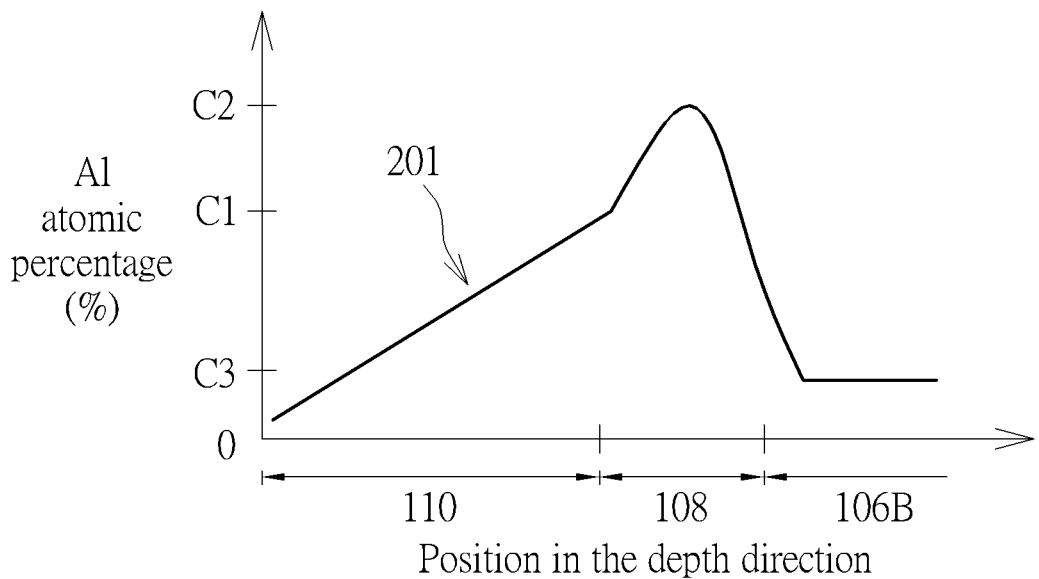
FIG. 3, FIG. 4, FIG. 5 and FIG. 6 are the concentration profiles of the atomic percentage of the same group III element such as aluminum varying with different positions in the depth direction in the composition gradient layer, the tensile stress layer, and the uppermost second superlattice layer of the HEMTs according to various embodiments of the present disclosure.

FIG. 3 shows a concentration profile of the atomic percentage of the same group III element such as aluminum (Al) varying with different positions in the depth direction in the composition gradient layer, the tensile stress layer and the uppermost second superlattice layer of a HEMT according to an embodiment of the present disclosure. The horizontal axis of FIG. 3 is the position in the depth direction of the composition gradient layer 110, the tensile stress layer 108, and the uppermost second superlattice layer 106B. The vertical axis of FIG. 3 is the atomic percentage of aluminum (Al). According to an embodiment, as shown in FIG. 3, the aluminum (Al) atomic percentage of the uppermost second superlattice layer 106B is approximately at the value C3, and the highest aluminum (Al) atomic percentage of the tensile stress layer 108 is at the value C2. The aluminum (Al) atomic percentage of the composition gradient layer 110 is gradually decreased in the depth direction from bottom to top, such as being gradually decreased from the value C1 to the value close to zero. In one embodiment, the value C3 is about 10%, the value C2 is about 50%, and the value C1 is about 30%. In this embodiment, the concentration profile of the atomic percentage of aluminum (Al) varying with the position in the depth direction in the composition gradient layer 110 of FIG. 3 may be a straight line profile 201. In one embodiment, the atomic percentage of aluminum (Al) in the composition gradient layer 110 may also have other values higher or lower than the value C1 as a starting value and be gradually decreased from the starting value to the value close to zero along the depth direction from bottom to top. According to an embodiment of the present disclosure, the average atomic concentration of aluminum (Al) in the tensile stress layer 108 is higher than the average atomic concentration of aluminum (Al) in the composition gradient layer 110, and the average atomic concentration of aluminum (Al) in the composition gradient layer 110 is higher than the average atomic concentration of aluminum (Al) in the uppermost second superlattice layer 106B.

Figure 4:
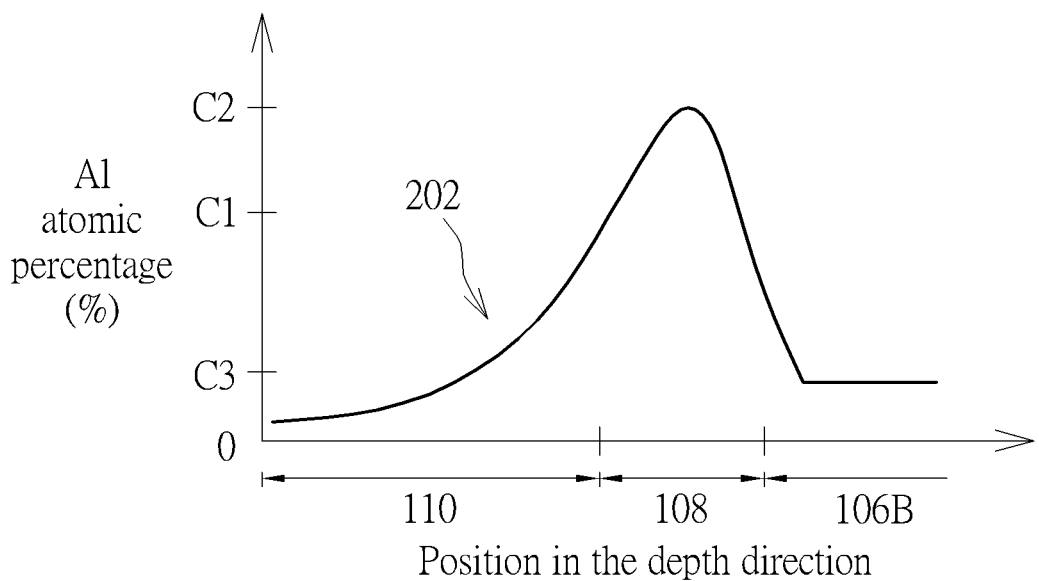
Figure 5:
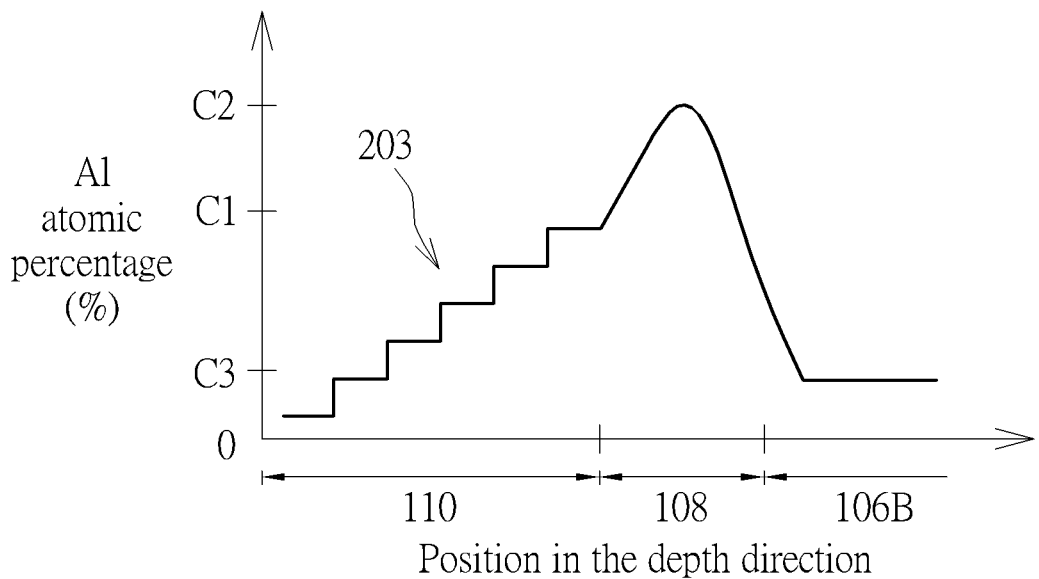
Figure 6:
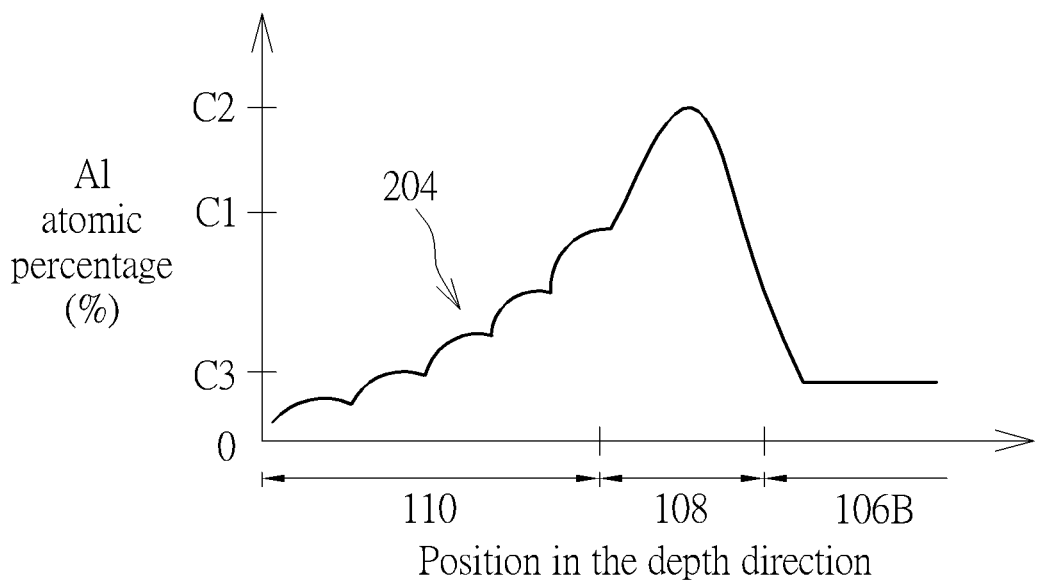

FIG. 4, FIG. 5 and FIG. 6 are various concentration profiles of the atomic percentage of the same group III element such as aluminum (Al) varying with different positions in the depth direction in the composition gradient layer, the tensile stress layer, and the uppermost second superlattice layer of the HEMTs according to some embodiments of the present disclosure. The difference between the embodiments of FIG. 4 and FIG. 3 is that the concentration profile of the atomic percentage of aluminum (Al) varying with different positions in the depth direction in the composition gradient layer 110 of FIG. 4 may be an arc profile 202. The difference between the embodiments of FIG. 5 and FIG. 3 is that the concentration profile of the atomic percentage of aluminum (Al) varying with different positions in the depth direction in the composition gradient layer 110 of FIG. 5 may be a step-shaped profile 203. The difference between the embodiments of FIG. 6 and FIG. 3 is that the concentration profile of the atomic percentage of aluminum (Al) varying with different positions in the depth direction in the composition gradient layer 110 of FIG. 6 may be a wavy profile 204. For other similar parts of FIG. 4, FIG. 5 and FIG. 6, please refer to the aforementioned description of FIG. 3.

Figure 7:
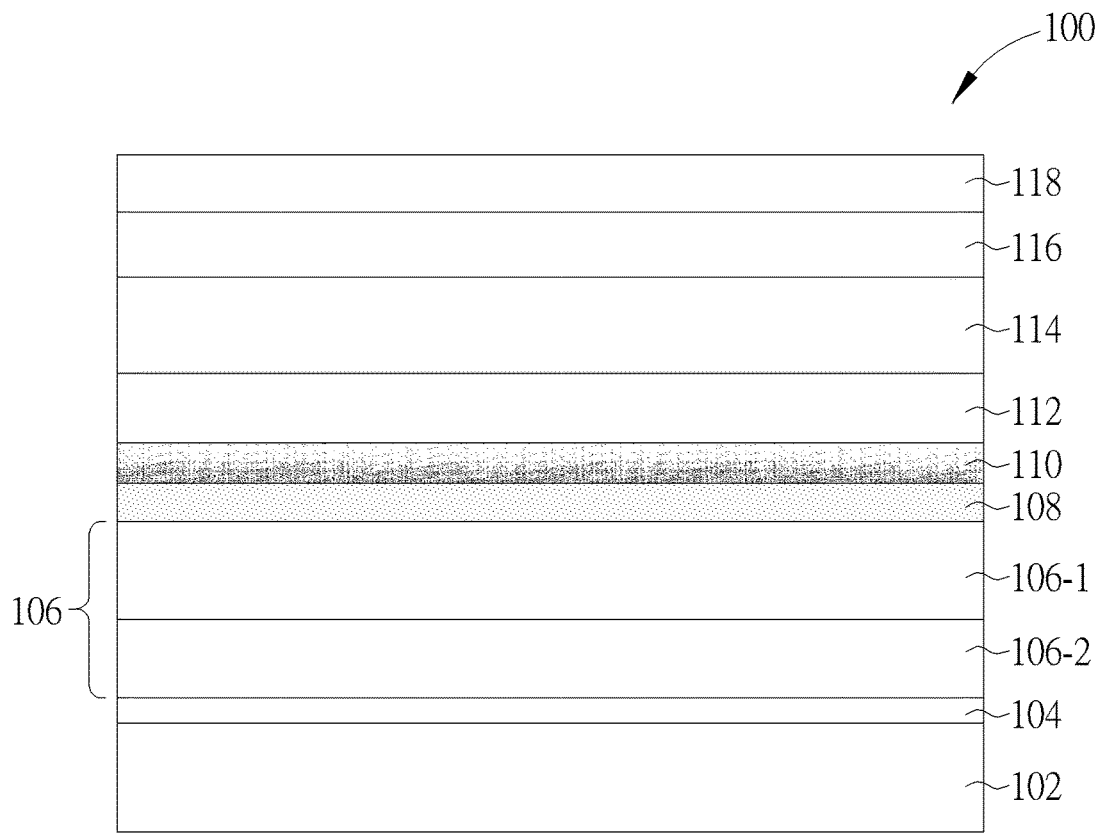
FIG. 7, FIG. 8, FIG. 9 and FIG. 10 are schematic cross-sectional diagrams of various intermediate stages of fabricating a HEMT according to one embodiment of the present disclosure.

FIG. 7, FIG. 8, FIG. 9, and FIG. 10 are schematic cross-sectional diagrams of various intermediate stages of fabricating the HEMT 100 according to an embodiment of the present disclosure. According to an embodiment, as shown in FIG. 7, a substrate 102 is provided. In addition, a nucleation layer 104, a superlattice structure 106, a tensile stress layer 108, a composition gradient layer 110, an electrical isolation layer 112, a channel layer 114, a barrier layer 116 and a doped semiconductor cap layer 118 are formed on the substrate 102 in sequence. In one embodiment, the superlattice structure 106 may be composed of a first superlattice stack 106-1 disposed on a second superlattice stack 106-2. In another embodiment, the superlattice structure 106 may be composed of the first superlattice stack 106-1.

In one embodiment, the substrate 102 may be a bulk silicon substrate, a silicon carbide (SiC) substrate, a sapphire substrate, a silicon-on-insulator (SOI) substrate, or a germanium-on-insulator (GOI) substrate, but not limited thereto. In another embodiment, the substrate 102 further includes a single or multiple layers of insulating material and/or other suitable material layers (such as a semiconductor layer) and a core layer. The insulating material layer may be oxide, nitride, oxynitride, or other suitable insulating materials. The core layer may be silicon carbide (SiC), aluminum nitride (AlN), aluminum oxide ($Al_2O_3$), aluminum gallium nitride (AlGaN), zinc oxide (ZnO) or gallium oxide ($Ga_2O_3$), or other suitable ceramic materials. In one embodiment, the single or multiple layers of insulating material and/or other suitable material layers wraps the core layer.

The nucleation layer 104 may be optionally disposed on the substrate 102, which has fewer lattice defects, so that the epitaxial quality of the superlattice structure 106 grown on the nucleation layer 104 may be improved. In one embodiment, the nucleation layer 104 may include an aluminum nitride (AlN) stacked layer, for example, including a first nitride layer and a second nitride layer. In one embodiment, the first nitride layer is, for example, a low-temperature aluminum nitride layer (LT-AlN), and the second nitride layer is, for example, a high-temperature aluminum nitride layer (HT-AlN). The LT-AlN layer may be deposited by metal-organic CVD (MOCVD) at an ambient temperature of 800° C. to 1100° C., and the HT-AlN layer may be deposited by MOCVD at an ambient temperature of 1100° C. to 1400° C., but not limited thereto.

The superlattice structure 106 is disposed on the substrate 102. According to an embodiment of the present disclosure, the second superlattice stack 106-2 of the superlattice structure 106 may be optionally disposed on the nucleation layer 104, and then the first superlattice stack 106-1 is disposed on the second superlattice stack 106-2. Alternatively, when the second superlattice stack 106-2 is omitted, the first superlattice stack 106-1 may be disposed on the nucleation layer 104. The superlattice structure 106 may be used to reduce the degree of lattice mismatch between the substrate 102 and the semiconductor layer disposed on the superlattice structure 106, and to reduce the stress caused by the lattice mismatch. According to an embodiment of the present disclosure, as shown in FIG. 2, the first superlattice stack 106-1 may include a plurality of pairs of first superlattice layers 106A and second superlattice layers 106B. Similarly, the second superlattice stack 106-2 may include a plurality of pairs of superlattice layers, such as third superlattice layers and fourth superlattice layers. According to different requirements, the first superlattice stack 106-1 and the second superlattice stack 106-2 may each be a structure formed by periodically and alternately stacking at least two kinds of group III-V semiconductor layers. For example, each of the first superlattice stack 106-1 and the second superlattice stack 106-2 may include a plurality of pairs of AlN thin layers and AlGaN thin layers, or a plurality of pairs of AlN thin layers and GaN thin layers. Alternatively, each of the first superlattice stack 106-1 and the second superlattice stack 106-2 may be a structure composed of a stack of multiple group III-V semiconductor layers with gradually-varied composition ratio. For example, the composition ratio of aluminum in aluminum gallium nitride ($Al_aGa_{(1-a)}N$, wherein $0.15 \leq a \leq 0.9$) is gradually decreased from the lower superlattice layer to the upper superlattice layer, but not limited thereto. According to an embodiment, the superlattice structure 106 may be formed by an atomic layer deposition (ALD) process, through adjusting the gas source ratio for depositing each atomic layer, such as adjusting gas source ratio of aluminum (Al), nitrogen (N), and gallium (Ga) may deposit a stack of multiple superlattice layers with various composition ratios.

According to an embodiment of the present disclosure, the tensile stress layer 108 may be optionally disposed on the superlattice structure 106, and the composition gradient layer 110 may be formed on the tensile stress layer 108. The compositions of the tensile stress layer 108 and the composition gradient layer 110 are as the aforementioned description, and not repeated herein. According to an embodiment, the composition gradient layer 110 and the tensile stress layer 108 may be formed by an ALD process, through adjusting the gas source ratio for depositing each atomic layer, such as adjusting the gas source ratio of aluminum (Al), nitrogen (N) and gallium (Ga) may deposit a stack of multiple atomic layers with gradually-varied composition ratio to form the composition gradient layer 110 with, for example, a gradually-varied atomic percentage or atomic concentration of aluminum (Al). In one embodiment, the thickness of the tensile stress layer 108 may be 2 nm to 20 nm. Alternatively, the thickness of the tensile stress layer 108 may be 0.2% to 2% of the thickness of the electrical isolation layer 112. The thickness of the composition gradient layer 110 may be 5 nm to 50 nm. Alternatively, the thickness of the composition gradient layer 110 may be 0.5% to 5% of the thickness of the electrical isolation layer 112.

According to an embodiment of the present disclosure, the electrical isolation layer 112 is disposed on the composition gradient layer 110. The electrical isolation layer 112 has a higher resistivity than other layers, thereby avoiding leakage current between the substrates 102 and the semiconductor layers disposed on the electrical isolation layer 112. The channel layer 114 may be disposed on the electrical isolation layer 112, and the barrier layer 116 may be disposed on the channel layer 114. The compositions of the channel layer 114 and the barrier layer 116 are as the aforementioned description, and not repeated herein. The doped semiconductor cap layer 118 may be formed on the barrier layer 116 for depleting the two-dimensional electron gas (2-DEG) region to achieve the normally-off state of the HEMT. The doped semiconductor cap layer 118 may be one or more doped group III-V semiconductor layers, such as GaN doped with p-type dopants or n-type dopants. The composition of the doped semiconductor cap layer 118 may be GaN, AlGaN, InGaN or InAlGaN, and the dopant thereof may be C, Fe, Mg or Zn, but not limited thereto. According to an embodiment, the doped semiconductor cap layer 118 may be a p-type GaN layer.

Figure 8:
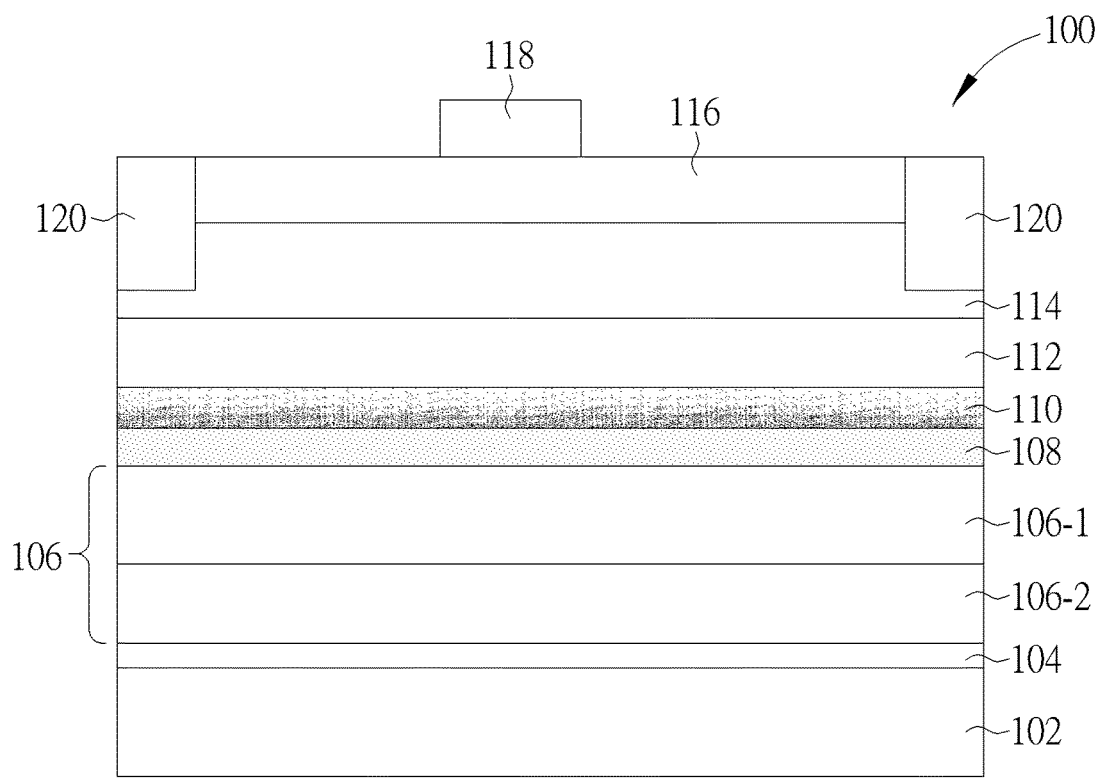

Next, according to an embodiment of the present disclosure, as shown in FIG. 8, a patterned doped semiconductor cap layer 118 is formed on the barrier layer 116. The patterned doped semiconductor cap layer 118 may be formed by a photolithography process and an etching process. Then, an isolation region 120 is formed on the periphery of the HEMT to isolate the adjacent HEMTs from each other. According to an embodiment, the isolation region 120 passes through the barrier layer 116 and may extend downward into the channel layer 114. The isolation region 120 is separated from the electrical isolation layer 112 by a distance. In one embodiment, the isolation region 120 may be a shallow trench isolation (STI), which may be formed by forming a trench in the barrier layer 116 and the channel layer 114 through an etching process, and then filling the trench with one or more layers of dielectric materials, such as silicon oxide, silicon nitride, or a combination thereof. Thereafter, a chemical mechanical polishing (CMP) process is performed on the aforementioned structure to form the isolation region 120. In another embodiment, the isolation region 120 may be formed by ion implantation. A hard mask is used to cover the area outside the predetermined area where the isolation region 120 is to be formed, and then a dopant is implanted in the barrier layer 116 and the channel layer 114 to form the isolation region 120. The dopant is such as helium or carbon.

Figure 9:
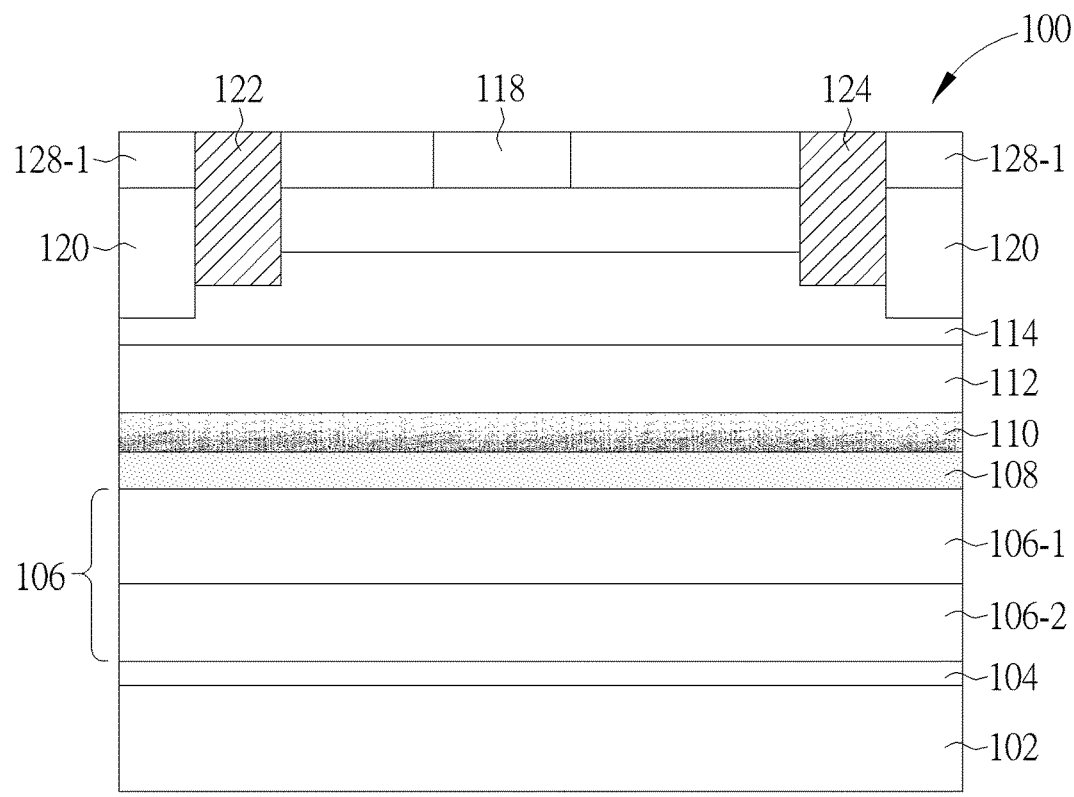

Next, according to an embodiment of the present disclosure, as shown in FIG. 9, a first passivation layer 128-1 is formed on the isolation region 120 and the barrier layer 116, and a source electrode 122 and a drain electrode 124 are formed on two opposite sides of the doped semiconductor cap layer 118 respectively. In one embodiment, the source electrode 122 and the drain electrode 124 pass through the first passivation layer 128-1 and the barrier layer 116, and extend downward into the channel layer 114, so that the bottoms of the source electrode 122 and the drain electrode 124 are higher than the bottom of the isolation region 120 and lower than the top surface of the channel layer 114. In another embodiment, the source electrode 122 and the drain electrode 124 pass through the first passivation layer 128-1 and extend downward into the barrier layer 116, so that the bottoms of the source electrode 122 and the drain electrode 124 are higher than the bottom of the isolation region 120 and lower than the top surface of the barrier layer 116.

According to an embodiment, the first passivation layer 128-1 may be firstly deposited to cover the isolation region 120, the barrier layer 116 and the doped semiconductor cap layer 118, and then contact holes of the source electrode 122 and the drain electrode 124 are formed in the first passivation layer 128-1, the barrier layer 116 and the channel layer 114, and on two opposite sides of the doped semiconductor cap layer 118 respectively. Thereafter, a conductive material layer is deposited in the contact holes and on the first passivation layer 128-1. In one embodiment, the source electrode 122 and the drain electrode 124 may be formed through a CMP process, such that the top surface of the doped semiconductor cap layer 118 is exposed, where the top surfaces of the source electrode 122 and the drain electrode 124 may be in the same level with the top surface of the doped semiconductor cap layer 118. In another embodiment, after the conductive material layer is deposited, an etching process may be used to remove the conductive material layer outside the contact holes to form the source electrode 122 and the drain electrode 124, such that the top surface of the doped semiconductor cap layer 118 may still be covered by the first passivation layer 128-1.

According to an embodiment, the source electrode 122 and the drain electrode 124 may have a single-layered or multiple-layered structure, and the composition thereof may include an ohmic contact metal. The ohmic contact metal refers to a metal, an alloy or a stacked layer thereof that produces ohmic contact with a semiconductor layer (such as the channel layer 114). The ohmic contact metal is for example Ti, Ti/Al, Ti/Al/Ti/TiN, Ti/Al/Ti/Au, Ti/Al/Ni/Au or Ti/Al/Mo/Au, but not limited thereto.

Figure 10:
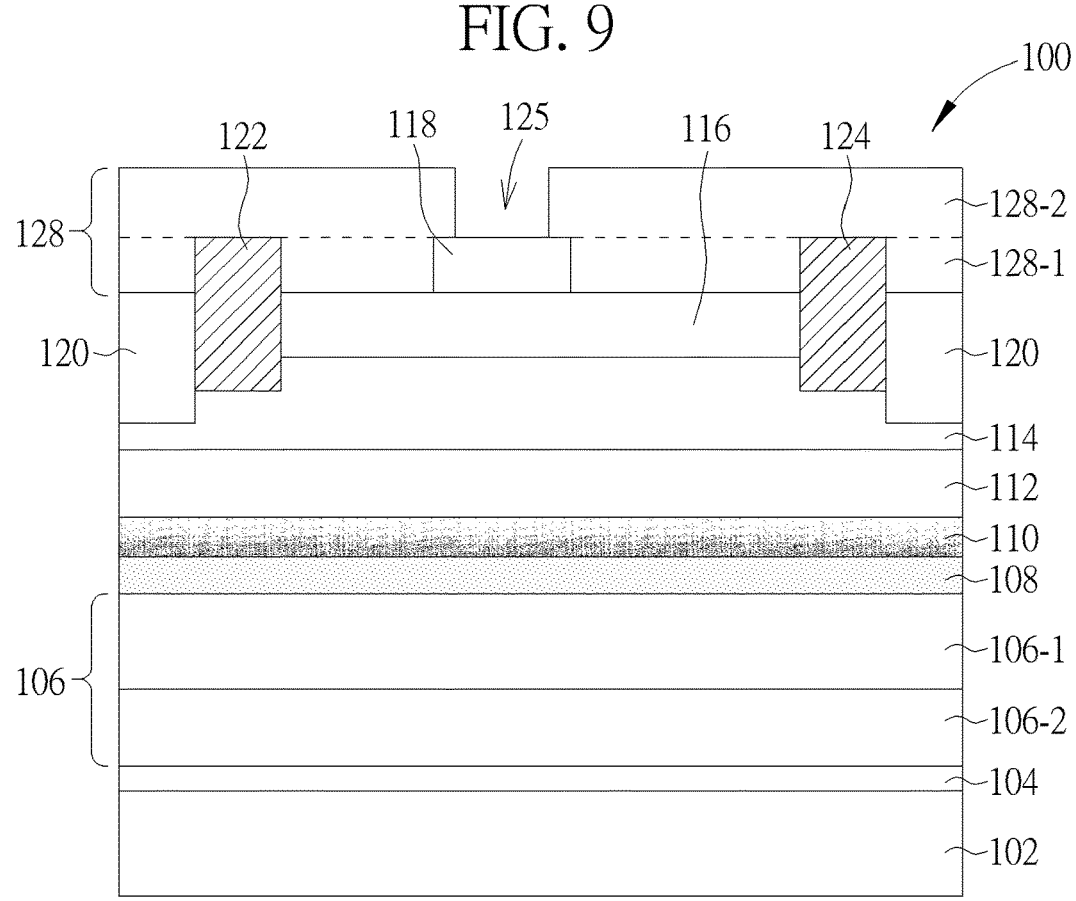

Next, according to an embodiment of the present disclosure, as shown in FIG. 10, a second passivation layer 128-2 is formed to cover the first passivation layer 128-1, the doped semiconductor cap layer 118, the source electrode 122 and the drain electrode 124. The first passivation layer 128-1 and the second passivation layer 128-2 may be collectively referred to as the passivation layer 128. Then, a contact hole 125 of the gate electrode 126 is formed in the second passivation layer 128-2 to expose the top surface of the doped semiconductor cap layer 118. According to an embodiment of the present disclosure, for the case where an etch stop layer (not shown) is disposed on the top surface of the doped semiconductor cap layer 118, the etch stop layer may be exposed from the contact hole 125. The etch stop layer may be used to protect the doped semiconductor cap layer 118 and to prevent the doped semiconductor cap layer 118 from being in direct contact with the etchant used in the etching process of forming the contact hole 125. Afterwards, a conductive material layer is deposited in the contact hole 125 and on the second passivation layer 128-2. Then, the conductive material layer is patterned through a photolithography process and an etching process to form the gate electrode 126 as shown in FIG. 1. In one embodiment, the top surface of the gate electrode 126 is higher than the top surface of the passivation layer 128. In another embodiment, a part of the gate electrode 126 may further extend onto the top surface of the passivation layer 128.

According to an embodiment, the gate electrode 126 may have a single-layered or multiple-layered structure, for example, a double-layered structure including a first conductive layer and a second conductive layer. Where, the first conductive layer may be in direct contact with the doped semiconductor cap layer 118, and its composition includes a Schottky contact metal. The Schottky contact metal refers to a metal, an alloy or a stacked layer thereof that produces Schottky contact with a semiconductor layer (such as the doped semiconductor cap layer 118). The Schottky contact metal is for example TiN, W, Pt, Ni or Ni, but not limited thereto. The composition of the second conductive layer may include Ti, Al, Au, or Mo, but not limited thereto. In one embodiment, the first conductive layer may further include a metal nitride of a refractory metal. The refractory metal may be selected from a group consisting of titanium, zirconium, hafnium, vanadium, niobium, tantalum, chromium, molybdenum, tungsten, manganese, technetium, rhenium, ruthenium, osmium, rhodium and iridium.

According to an embodiment of the present disclosure, the materials of the first passivation layer 128-1 and the second passivation layer 128-2 include aluminum oxide ($Al_2O_3$), silicon nitride ($Si_3N_4$), silicon oxynitride (SiON) or silicon oxide ($SiO_2$). In one embodiment, the materials of the first passivation layer 128-1 and the second passivation layer 128-2 may be the same. In another embodiment, the materials of the first passivation layer 128-1 and the second passivation layer 128-2 may be different from each other.

According to one objective of the embodiments of the present disclosure, it avoids a current transmission path between the superlattice structure and the electrical isolation layer of the HEMT. According to another objective of the embodiments of the present disclosure, it avoids a cross-link interference problem due to leakage current between the adjacent HEMTs. Therefore, the accuracy of the bare die chip probing (CP) test before packaging is improved to more accurately determine whether the HEMTs meet the electrical specifications. Meanwhile, the 2-DEG performance of the HEMTs is maintained and the electrical performance of the HEMTs is also improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a superlattice structure, disposed on a substrate;
   an electrical isolation layer, disposed on the superlattice structure;
   a channel layer, disposed on the electrical isolation layer; and
   a composition gradient layer, disposed between the electrical isolation layer and the superlattice structure, wherein the composition gradient layer and the superlattice structure include a same group III element, and an atomic percentage of the same group III element in the composition gradient layer is gradually decreased in a direction from the superlattice structure to the electrical isolation layer.

2. The semiconductor structure of claim 1, further comprising a tensile stress layer, disposed between the superlattice structure and the composition gradient layer, wherein the tensile stress layer includes the same group III element.

3. The semiconductor structure of claim 2, wherein an average atomic concentration of the same group III element in the tensile stress layer is higher than an average atomic concentration of the same group III element in the composition gradient layer.

4. The semiconductor structure of claim 2, wherein the composition gradient layer comprises aluminum gallium nitride ($Al_xGa_{(1-x)}N$), wherein $0.1<x<0.5$, and the value of x is gradually decreased in a direction from the superlattice structure to the electrical isolation layer, and the tensile stress layer comprises aluminum nitride (AlN).

5. The semiconductor structure of claim 4, wherein the electrical isolation layer comprises carbon-doped gallium nitride (c-GaN).

6. The semiconductor structure of claim 2, wherein the thickness of the tensile stress layer is 0.2% to 2% of the thickness of the electrical isolation layer.

7. The semiconductor structure of claim 1, wherein the composition gradient layer includes a dopant, and the dopant comprises carbon or iron.

8. The semiconductor structure of claim 1, wherein the electrical isolation layer includes another group III element, and the composition gradient layer includes the another group III element, and an atomic percentage of the another group III element in the composition gradient layer is gradually increased in the direction from the superlattice structure to the electrical isolation layer.

9. The semiconductor structure of claim 1, wherein the electrical isolation layer includes a carbon dopant, and the concentration of the carbon dopant in the electrical isolation layer is gradually increased in a direction from the composition gradient layer to the channel layer.

10. The semiconductor structure of claim 1, wherein an average atomic concentration of the same group III element in the composition gradient layer is lower than an average atomic concentration of the same group III element in the superlattice structure.

11. The semiconductor structure of claim 1, wherein the superlattice structure comprises a plurality of pairs of a first superlattice layer and a second superlattice layer stacked in each pair, the first superlattice layer has tensile stress, the second superlattice layer has compressive stress, and the second superlattice layer is stacked on the first superlattice layer, and an average atomic concentration of the same group III element in the composition gradient layer is higher than an average atomic concentration of the same group III element in the second superlattice layers.

12. The semiconductor structure of claim 11, wherein the first superlattice layer comprises aluminum nitride (AlN), and the second superlattice layer comprises aluminum gallium nitride ($Al_yGa_{(1-y)}N$, wherein $0.05<y<0.3$).

13. The semiconductor structure of claim 11, wherein the superlattice structure further comprises a plurality of pairs of a third superlattice layer and a fourth superlattice layer stacked in a pair, which are disposed under the plurality of pairs of the first superlattice layer and the second superlattice layer stacked in each pair, and the composition of the fourth superlattice layer is different from the composition of the second superlattice layer.

14. The semiconductor structure of claim 1, wherein the thickness of the composition gradient layer is 0.5% to 5% of the thickness of the electrical isolation layer.

15. The semiconductor structure of claim 1, wherein a concentration profile of the same group III element in the composition gradient layer comprises a straight line profile, an arc profile, a step-shaped profile or a wavy profile.

16. A high electron mobility transistor (HEMT), comprising:
    a semiconductor structure of claim 1;
    a barrier layer, disposed on the channel layer;
    a doped semiconductor cap layer, disposed on the barrier layer;
    a gate electrode, disposed on the doped semiconductor cap layer; and a source electrode and a drain electrode, disposed on two sides of the gate electrode respectively.

* * * * *